(12) United States Patent
Hsiao et al.

(10) Patent No.: US 11,653,503 B2
(45) Date of Patent: *May 16, 2023

(54) SEMICONDUCTOR STRUCTURE WITH DATA STORAGE STRUCTURE AND METHOD FOR MANUFACTURING THE SAME

(71) Applicant: Taiwan Semiconductor Manufacturing Co., Ltd., Hsinchu (TW)

(72) Inventors: Woan-Yun Hsiao, Yilan County (TW); Huang-Kui Chen, Hsinchu (TW); Tzong-Sheng Chang, Hsinchu County (TW); Ya-Chin King, Taipei (TW); Chrong-Jung Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 217 days.

This patent is subject to a terminal disclaimer.

(21) Appl. No.: 16/948,034

(22) Filed: Aug. 28, 2020

(65) Prior Publication Data

US 2020/0395411 A1 Dec. 17, 2020

Related U.S. Application Data

(60) Continuation of application No. 16/134,063, filed on Sep. 18, 2018, now Pat. No. 10,763,305, which is a
(Continued)

(51) Int. Cl.
*H01L 21/82* (2006.01)
*H01L 27/24* (2006.01)
(Continued)

(52) U.S. Cl.
CPC .... *H01L 27/2436* (2013.01); *H01L 29/41725* (2013.01); *H01L 29/78* (2013.01)

(58) Field of Classification Search
None
See application file for complete search history.

(56) References Cited

U.S. PATENT DOCUMENTS

| 5,075,249 A | 12/1991 | Sato et al. |
| 6,020,229 A | 2/2000 | Yamane et al. |
| | (Continued) | |

FOREIGN PATENT DOCUMENTS

| CN | 103811493 A | 5/2014 |
| JP | 57103348 S | 9/1982 |
| | (Continued) | |

*Primary Examiner* — Bilkis Jahan
(74) *Attorney, Agent, or Firm* — Haynes and Boone, LLP

(57) ABSTRACT

A semiconductor structure and a method for forming the same are provided. The semiconductor structure includes a substrate and a gate structure formed over the substrate. The semiconductor structure further includes a first source/drain structure and a second source/drain structure formed in the substrate adjacent to the gate structure. The semiconductor structure further includes an interlayer dielectric layer formed over the substrate to cover the gate structure, the first source/drain structure, and the second source/drain structure. The semiconductor structure further includes a first conductive structure formed in the interlayer dielectric layer over the first source/drain structure. The semiconductor structure further includes a second conductive structure formed in the interlayer dielectric layer over the second source/drain structure. In addition, the first conductive structure is in direct contact with the first source/drain structure, and the second conductive structure is not in direct contact with the second source/drain structure.

20 Claims, 8 Drawing Sheets

Related U.S. Application Data division of application No. 14/885,035, filed on Oct. 16, 2015, now Pat. No. 10,090,360.

(60) Provisional application No. 62/116,059, filed on Feb. 13, 2015.

(51) Int. Cl.
*H01L 29/417* (2006.01)
*H01L 29/78* (2006.01)

(56) References Cited

U.S. PATENT DOCUMENTS

| | | | |
|---|---|---|---|
| 7,118,962 B2 | 10/2006 | Lee | |
| 7,292,469 B2 | 11/2007 | Lee et al. | |
| 7,348,617 B2 | 3/2008 | Kumura et al. | |
| 7,446,361 B2 | 11/2008 | Maruyama | |
| 7,459,747 B2 | 12/2008 | Obuchi | |
| 7,579,641 B2 | 8/2009 | Sashida | |
| 7,781,335 B2 | 8/2010 | Isono | |
| 7,989,874 B2 | 8/2011 | Lee | |
| 8,237,457 B2 | 8/2012 | Chakravarti et al. | |
| 8,852,961 B2 | 10/2014 | Wang | |
| 9,000,528 B2 | 4/2015 | Jung | |
| 9,023,699 B2 | 5/2015 | Chang et al. | |
| 9,076,819 B2 | 7/2015 | Wu et al. | |
| 9,082,867 B2 | 7/2015 | Roizin et al. | |
| 9,111,751 B2 | 8/2015 | Furukawa et al. | |
| 9,111,906 B2 | 8/2015 | Lin et al. | |
| 9,305,996 B2 | 4/2016 | Nagai | |
| 9,337,194 B2 | 5/2016 | Chuang et al. | |
| 2011/0227136 A1* | 9/2011 | Park | H01L 29/665 |
| | | | 257/E21.409 |
| 2012/0252180 A1 | 10/2012 | Tomimatsu et al. | |
| 2013/0009257 A1* | 1/2013 | Ando | H01L 21/28176 |
| | | | 257/E21.409 |
| 2014/0284734 A1 | 9/2014 | Kanaya et al. | |
| 2015/0048439 A1 | 2/2015 | Shum et al. | |
| 2015/0069480 A1 | 3/2015 | Kanaya et al. | |

FOREIGN PATENT DOCUMENTS

| | | |
|---|---|---|
| JP | 01253959 H | 10/1989 |
| JP | 2005142571 A | 6/2005 |
| JP | 2012209331 A | 10/2012 |
| JP | 2014041991 A | 3/2014 |

* cited by examiner

SEMICONDUCTOR STRUCTURE WITH DATA STORAGE STRUCTURE AND METHOD FOR MANUFACTURING THE SAME

PRIORITY CLAIM AND CROSS-REFERENCE

This Application is a continuation application of U.S. patent application Ser. No. 16/134,063 filed Sep. 18, 2018, which is a Divisional Application of U.S. patent application Ser. No. 14/885,035, filed on Oct. 16, 2015, and issued as U.S. Pat. No. 10,090,360, which claims the benefit of U.S. Provisional Application No. 62/116,059, filed on Feb. 13, 2015, and entitled "A novel memory structure for OTP memory and RRAM application", the entirety of each of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
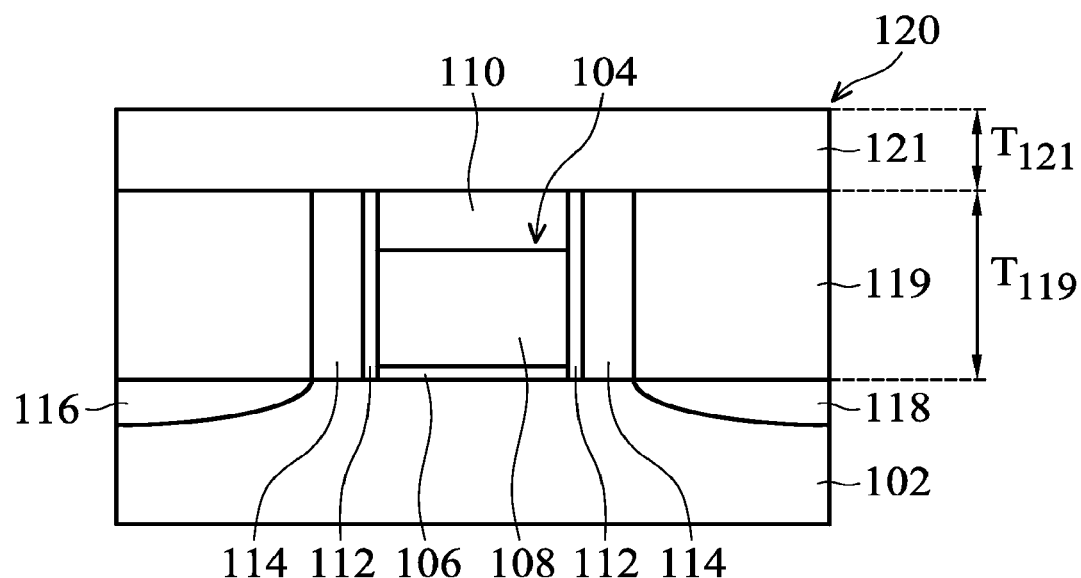
FIGS. 1A to 1D are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for manufacturing the same are provided. The semiconductor structure includes a gate structure, source/drain structures formed adjacent to the gate structure, and an interlayer dielectric layer covering the source/drain structures. A first conductive structure is formed through the interlayer dielectric layer over a source/drain structure to be connected with the source/drain structure. A second conductive structure is formed in the interlayer dielectric layer but is not in direct contact with any source/drain structure, such that the semiconductor structure can be used as a memory structure for data storage.

FIGS. 1A to 1D are cross-sectional representations of various stages of forming a semiconductor structure 100a in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

A gate structure 104 is formed over substrate 102, as shown in FIG. 1A in accordance with some embodiments. In some embodiments, gate structure 104 includes a gate dielectric layer 106 and a gate electrode layer 108.

In some embodiments, gate dielectric layer 106 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, gate electrode layer 108 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable conductive materials. In some embodiments, gate electrode layer 108 is made of polysilicon.

A hard mask layer 110 is formed over gate structure 104, as shown in FIG. 1A in accordance with some embodiments. In some embodiments, hard mask layer 110 is made of silicon oxide, silicon nitride, silicon oxynitride, or silicon carbide.

In addition, a sealing layer 112 is formed on the sidewalls of gate structure 104 and hard mask layer 110, as shown in FIG. 1A in accordance with some embodiments. Sealing layer 112 may protect gate structure 104 from damage or loss during subsequent processing and may also prevent oxidation during subsequent processing. In some embodiments, sealing layer 112 is made of silicon nitride, silicon oxide, silicon oxynitride, silicon carbide, or other applicable dielectric materials. Sealing layer 112 may include a single layer or multiple layers.

Spacers 114 are further formed on sealing layer 112 in accordance with some embodiments. In some embodiments, spacers 114 are made of silicon nitride, silicon oxide, silicon carbide, silicon oxynitride, or other applicable materials.

A first source/drain structure 116 and a second source/drain structure 118 are formed adjacent to gate structure 104 in substrate 102, as shown in FIG. 1A in accordance with some embodiments. More specifically, first source/drain structure 116 is formed at a first side of gate structure 104, and second source/drain structure 118 is formed at a second side of gate structure 104. That is, first source/drain structure 116 and second source/drain structure 118 are formed at opposite sides of gate structure 104.

In some embodiments, first source/drain structure 116 and second source/drain structure 118 are formed by using an implantation process or an epitaxial (epi) process. In some embodiments, first source/drain structure 116 and second source/drain structure 118 include Ge, SiGe, InAs, InGaAs, InSb, GaAs, GaSb, InAlP, InP, or the like.

After first source/drain structure 116 and second source/drain structure 118 are formed in substrate 102, an interlayer dielectric layer 120 is formed over substrate 102, as shown in FIG. 1A in accordance with some embodiments. In some embodiments, interlayer dielectric layer 120 includes a first layer 119 and a second layer 121. In some embodiments, first layer 119 is formed by depositing a dielectric material over substrate 102 and polishing the dielectric material to expose the top surface of hard mask layer 110. Accordingly, the top surface of first layer 119 is substantially level with the top surface of hard mask layer 110 in accordance with some embodiments. In some embodiments, first layer 119 has a thickness $T_{119}$ in a range from about 300 Å to about 1000 Å. In addition, the thickness $T_{119}$ may also be seen as the distance between the top surface of substrate 102 and the top surface of hard mask layer 110.

In addition, second layer 121 is formed on first layer 119 and gate structure 104 and has a thickness $T_{121}$ in a range from about 300 Å to about 1200 Å in accordance with some embodiments. In addition, the sum of thickness $T_{119}$ and thickness $T_{121}$ is equal to the thickness of interlayer dielectric layer 120 in accordance with some embodiments.

First layer 119 and second layer 121 may be made of the same or different dielectric materials, such as silicon oxide, silicon nitride, phosphosilicate glass (PSG), borophosphosilicate glass (BPSG), and/or other applicable dielectric materials. Interlayer dielectric layer 120 may be formed by chemical vapor deposition (CVD), physical vapor deposition, (PVD), atomic layer deposition (ALD), spin-on coating, or other applicable processes.

Figure 1B:
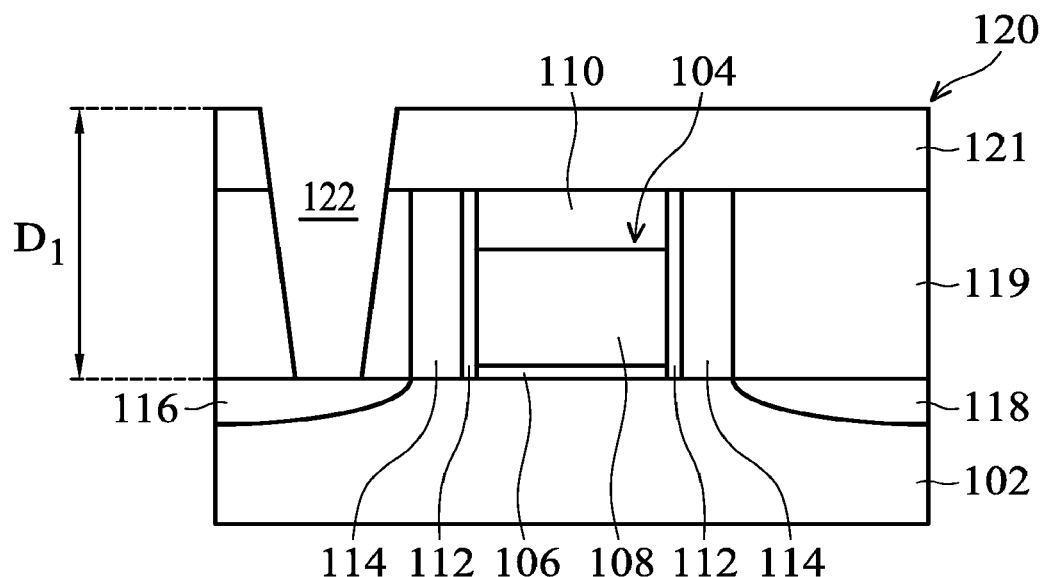

After interlayer dielectric layer 120 is formed, a first trench 122 is formed through interlayer dielectric layer 120, as shown in FIG. 1B in accordance with some embodiments. In addition, first trench 122 is formed over first source/trench structure 116, and first source/trench structure 116 is exposed by first trench 122. In some embodiments, first trench 122 is formed by using a first mask and etching interlayer dielectric layer 120 through the first mask. In some embodiments, first trench 122 has a first depth $D_1$ in a range from about 600 Å to about 2200 Å. As shown in FIG. 1B, since first trench 122 completely penetrates through interlayer dielectric layer 120, the first depth $D_1$ of first trench 122 may also be defined as the thickness of interlayer dielectric layer 120.

Figure 1C:
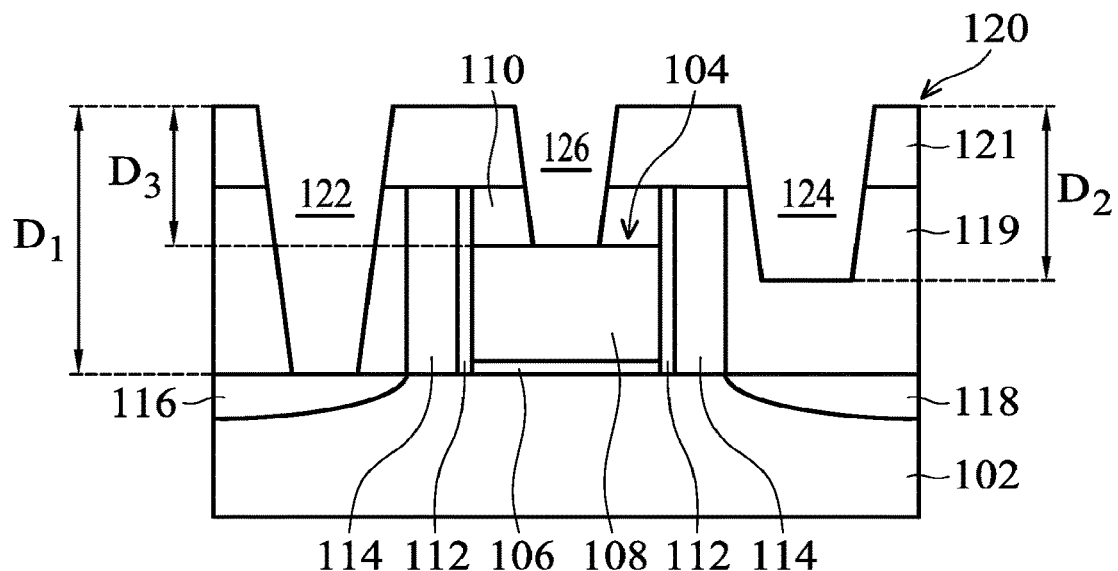

After first trench 122 is formed, a second trench 124 and a third trench 126 are formed in interlayer dielectric layer 120, as shown in FIG. 1C in accordance with some embodiments. In some embodiments, second trench 124 and third trench 126 are formed by using a mask and etching interlayer dielectric layer 120 and hard mask layer 110 through the mask in the same patterning process.

More specifically, second trench 124 is formed over second source/drain structure 118, and third trench 126 is formed over gate structure 104. As shown in FIG. 1C, unlike first trench 122, second trench 124 is formed in interlayer dielectric layer 120 but does not penetrate through interlayer dielectric layer 120. Accordingly, second source/drain structure 118 is not exposed by second trench 124. In some embodiments, second trench 124 has a second depth $D_2$, which is smaller than the first depth $D_1$ of first trench 122. In some embodiments, the second depth $D_2$ is in a range from about 300 Å to about 2185 Å.

In addition, third trench 126 is formed over gate structure 104. As shown in FIG. 1C, third trench 126 is formed through interlayer dielectric layer 120 and hard mask layer 110 over gate structure 104. Accordingly, the top surface of gate structure 104 is exposed by third trench 126.

In some embodiments, third trench 126 has a third depth $D_3$, which is smaller than the second depth $D_2$ of second trench 124 and also smaller than the first depth $D_1$ of first trench 122. In some embodiments, the third depth $D_3$ is in a range from about 300 Å to about 600 Å.

After first trench 122, second trench 124, and third trench 126 are formed, a first conductive structure 128, a second conductive structure 130, and a third conductive structure 132 are formed in first trench 122, second trench 124, and third trench 126 respectively.

In some embodiments, first conductive structure 128 includes a barrier layer 134 and a conductive layer 136. Barrier layer 134 may be formed on the sidewalls and bottom of first trench 122, and conductive layer 136 may be formed over barrier layer 134. In some embodiments, barrier layer 134 is made of tantalum nitride, although other materials, such as tantalum, titanium, titanium nitride, or the like, may also be used.

In some embodiments, conductive layer 136 is made of aluminum (Al), copper (Cu), tungsten (W), titanium (Ti), tantulum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminide nitride (TiAlN), other applicable conductive materials, or a combination thereof.

In some embodiments, second conductive structure 130 also includes a barrier layer 138 and a conductive layer 140. Barrier layer 138 may be formed on the sidewalls and bottom of second trench 124, and conductive layer 140 may be formed over barrier layer 138. In some embodiments, barrier layer 138 is made of tantalum nitride, although other materials, such as tantalum, titanium, titanium nitride, or the like, may also be used.

In some embodiments, conductive layer 140 is made of aluminum (Al), copper (Cu), tungsten (W), titanium (Ti), tantulum (Ta), titanium nitride (TiN), tantalum nitride (TaN), nickel silicide (NiS), cobalt silicide (CoSi), tantulum carbide (TaC), tantalum silicide nitride (TaSiN), tantalum carbide nitride (TaCN), titanium aluminide (TiAl), titanium aluminide nitride (TiAlN), other applicable conductive materials, or a combination thereof.

In some embodiments, third conductive structure 132 also includes a barrier layer 142 and a conductive layer 144. In some embodiments, barrier layer 142 is made of the same material used to make barrier layer 134. In some embodiments, conductive layer 144 is made of the same material used to make conductive layer 136.

In some embodiments, first conductive structure 128, second conductive structure 130, and third conductive structure 132 are formed in the same depositing process and include the same conductive material. In some embodiments, first conductive structure 128, second conductive structure 130, and third conductive structure 132 are formed separately and include different conductive materials. For example, the material used to form second conductive structure 130 may be chosen according to its application to function as a memory structure (Details will be described later).

Figure 1D:
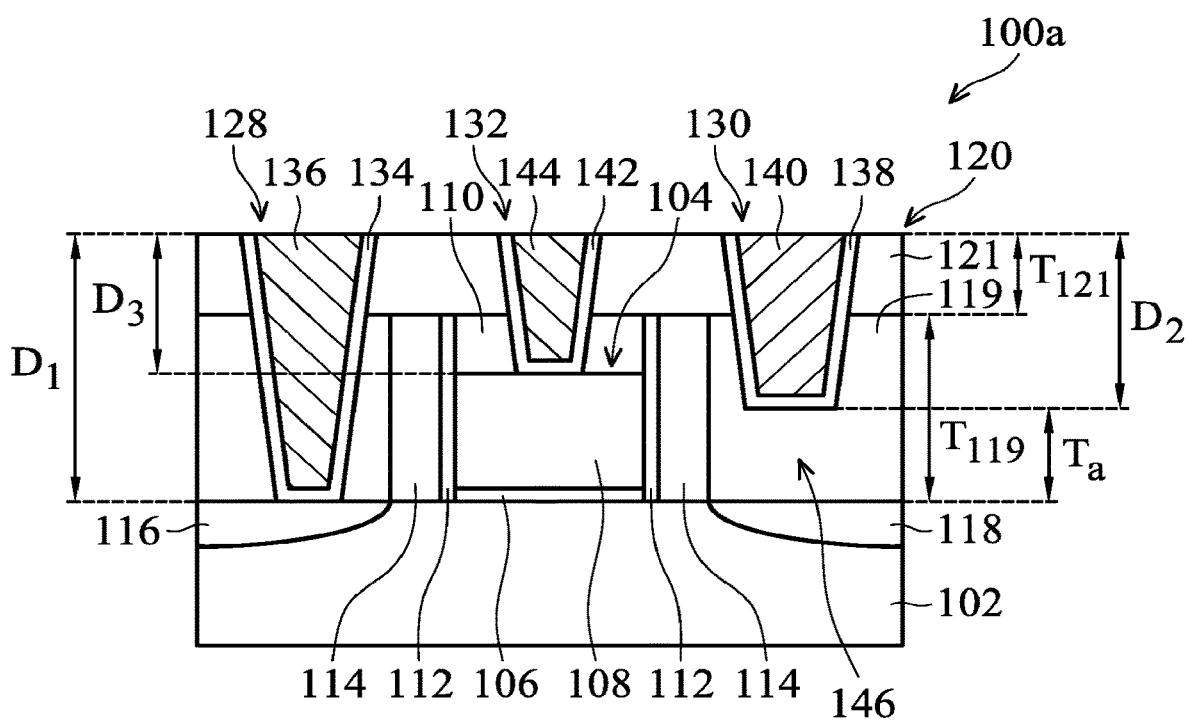

As shown in FIG. 1D, first conductive structure 128 is formed through interlayer dielectric layer 120, and therefore has a first depth $D_1$, which is the same as the thickness of interlayer dielectric layer 120. In addition, since first source/drain structure 116 is exposed by first trench 122, as shown in FIG. 1C, first conductive structure 128 formed in first trench 122 is in direct contact with first source/drain structure 116.

On the other hand, second conductive structure 130 is formed in interlayer dielectric layer 120 but does not penetrate through interlayer dielectric layer 120, and therefore second conductive structure 130 has a second depth $D_2$, which is smaller than the first depth $D_1$ of first conductive structure 128. In addition, since second source/drain structure 118 is not exposed by second trench 124, as shown in FIG. 1C, second conductive structure 130 formed in second trench 124 is not in direct contact with second source/drain structure 118.

As shown in FIG. 1D, semiconductor structure 100a includes first conductive structure 128, second conductive structure 130, and third conductive structure 132. The top surface of first conductive structure 128 is substantially level with the top surface of second conductive structure 130 and the top surface of third conductive structure 132. In addition, the top surfaces of first conductive structure 128, second conductive structure 130, and third conductive structure 132 are also substantially level with the top surface of interlayer dielectric layer 120.

Furthermore, the first depth $D_1$ of first conductive structure 128, which is substantially equal to the thickness of interlayer dielectric layer 120, is larger than the second depth $D_2$ of second conductive structure 130. Therefore, interlayer dielectric layer 120 is penetrated by first conductive structure 128 but is not penetrated by second conductive structure 130. Accordingly, second conductive structure 130 and second source/drain structure 118 are separated by a portion 146 of interlayer dielectric layer 120. In some embodiments, portion 146 of interlayer dielectric layer 120 has a thickness $T_a$ in a range from about 15 Å to about 500 Å. In some embodiment, a ratio of thickness $T_a$ of portion 146 to thickness $T_{119}$ of first layer 119 of interlayer dielectric layer 120 is in a range from about 1/20 to about 1/2. In some embodiments, a ratio of thickness $T_a$ of portion 146 to second depth $D_2$ is in a range from about 1/20 to about 1/2.

As described previously, although first trench 122 is formed through interlayer dielectric layer 120, second trench 124 is formed in interlayer dielectric layer 120 but does not penetrate through interlayer dielectric layer 120. Therefore portion 146 is left between second conductive structure 130 and second source/drain structure 118. Accordingly, portion 146 can be used for data storage in semiconductor structure 100a. However, if the thickness $T_a$ of portion 146 is too thick, the operation voltage of semiconductor structure 100a may become too large. On the other hand, if the thickness $T_a$ of portion 146 is too small, it may not be able to switch from one stage to another.

The thickness $T_a$ of portion 146 may be adjusted by altering the depth D2 of second conductive structure 130, and the depth D2 of second conductive structure 130 can be controlled by changing the condition of the etching process which is used to form second trench 124 and/or by changing the materials used to form interlayer dielectric layer 120.

In some embodiments, the processes described above are applied to a FinFET manufacturing process, although they may also be applied to a planar transistor manufacturing process. As described previously, second trench 124 can be formed in the process used to form third trench 126. Therefore, no additional masking process is required. Accordingly, the processes described above may be compatible with existing processes for forming logic devices without using additional complicated processes, such as additional masking processes.

Figure 2A:
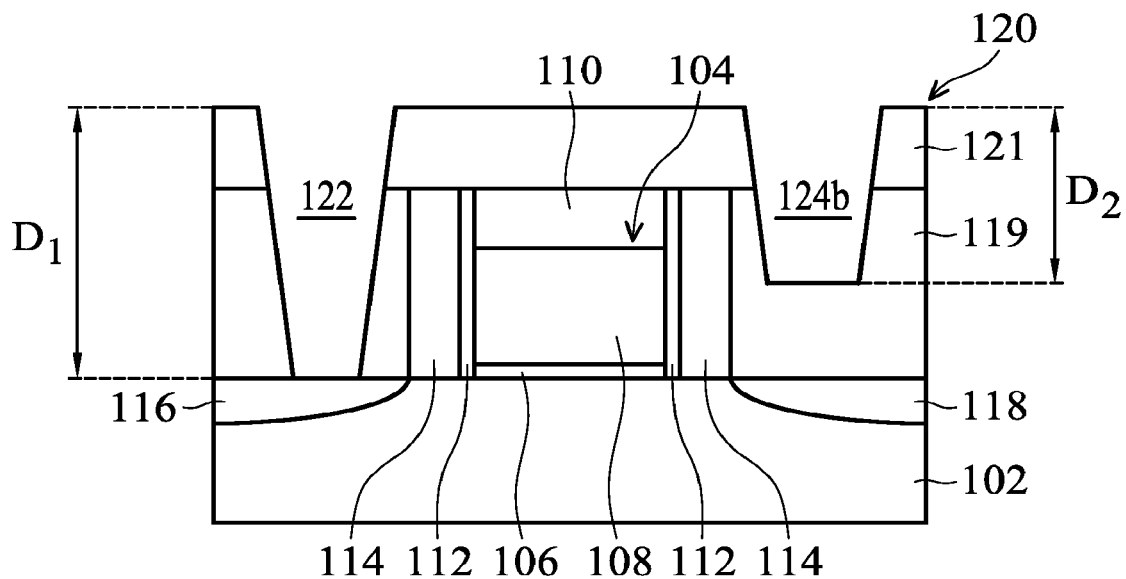
FIGS. 2A to 2C are cross-sectional representations of various stages of forming a semiconductor structure in accordance with some embodiments.
Figure 2B:
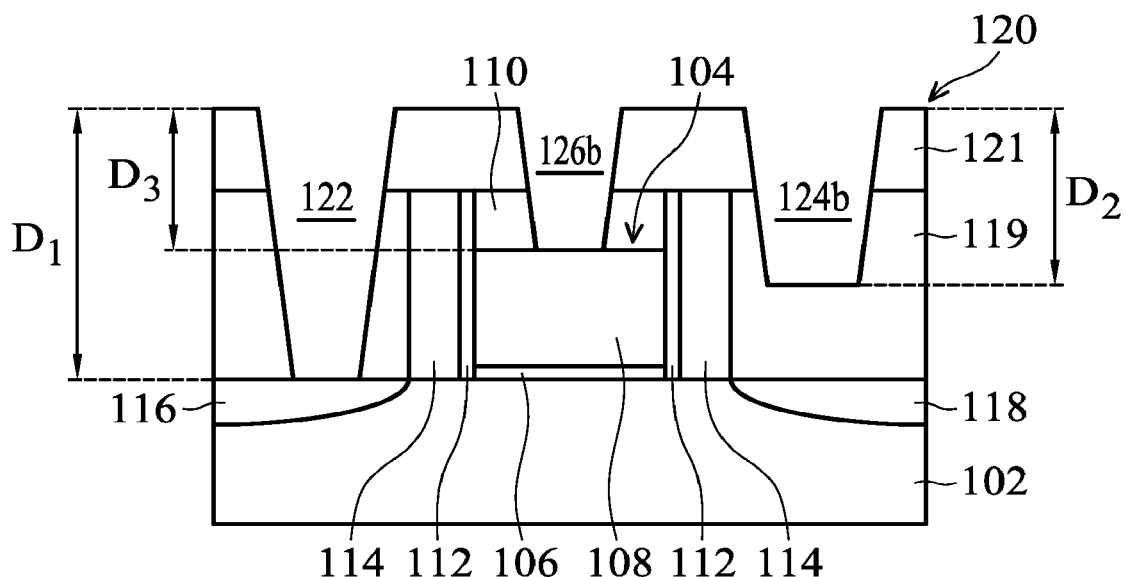
Figure 2C:
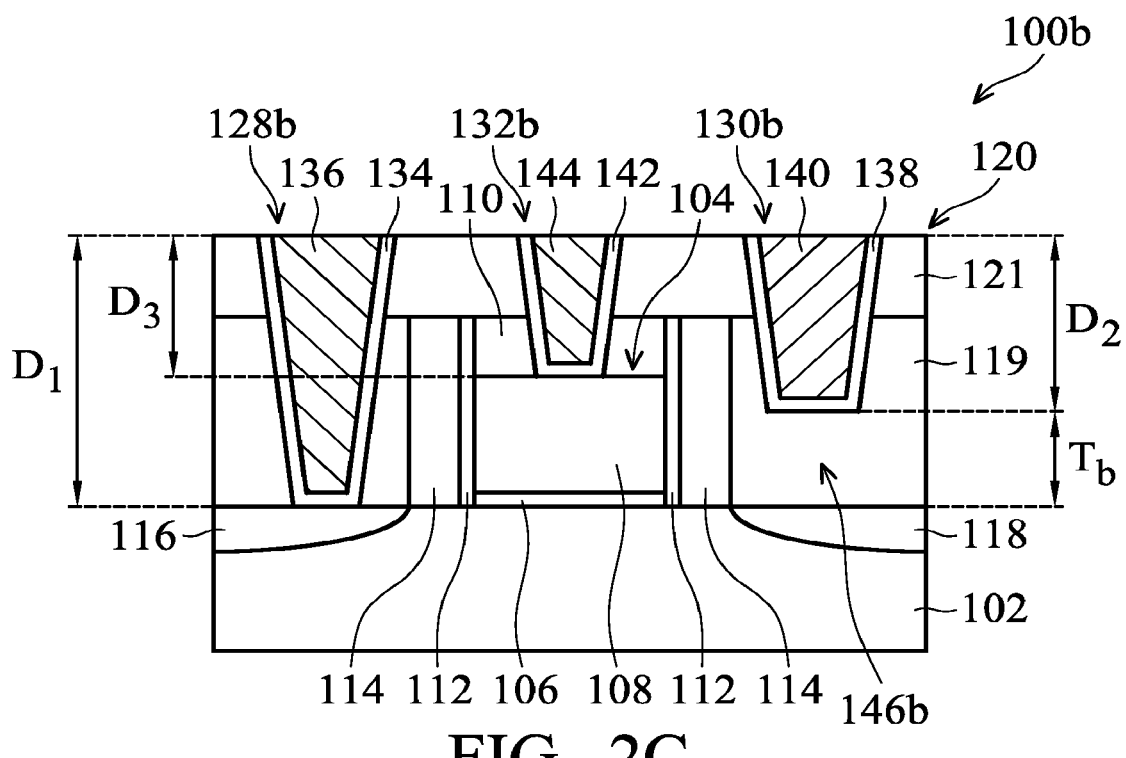

FIGS. 2A to 2C are cross-sectional representations of various stages of forming a semiconductor structure 100b in accordance with some embodiments. Semiconductor structure 100b is similar to, or the same as, semiconductor structure 100a described in FIGS. 1A to 1D, except a second trench 124b and a third trench 126b are formed separately. Materials and processes used to form semiconductor structure 100b may be the same as, or similar to, those used to form semiconductor structure 100a described previously and are not repeated herein.

More specifically, processes shown in FIGS. 1A and 1B and described previously are performed in accordance with some embodiments. After first trench 122 is formed in interlayer dielectric layer 120, second trench 124b is formed, as shown in FIG. 2A in accordance with some embodiments. After second trench 124b is formed, third trench 126b is formed, as shown in FIG. 2B in accordance with some embodiments.

That is, unlike second trench 124 and third trench 126 shown in FIG. 1C, second trench 124b and third trench 126b are formed by different patterning processes. Since second trench 124b and third trench 126b are formed separately, the second depth $D_2$ of second trench 124b can be better controlled and can be adjusted if required.

After first trench 122, second trench 124b, and third trench 126b are formed, a first conductive structure 128b, a second conductive structure 130b, and a third conductive structure 132b are respectively formed in first trench 122, second trench 124b, and third trench 126b. As shown in FIG. 2C, first conductive structure 128b is in direct contact with first source/drain structure 116, while second conductive structure 130b is not in direct contact with second source/drain structure 118.

In addition, first conductive structure 128b, second conductive structure 130b, and third conductive structure 132b also include barrier layers 134, 138, and 142 and conductive layers 136, 140, and 144 in accordance with some embodiments. Materials used to form first conductive structure 128b, second conductive structure 130b, and third conductive structure 132b may be similar to, or the same as, those used to form first conductive structure 128, second conductive structure 130, and third conductive structure 132 shown in FIG. 1D and have been described previously, and that description is not repeated herein.

As shown in FIGS. 2A and 2B, second trench 124b and third trench 126b are formed separately. That is, an additional masking process is used to form second trench 124b. Therefore, the second depth $D_2$ of second conductive structure 130b formed in second trench 124b can be adjusted without limiting by the formation of third conductive structure 132b formed in third trench 126b. Since second depth $D_2$ can be adjusted more freely and separately, thickness $T_b$ of portion 146 can also be adjusted according to its application. For example, thickness $T_b$ of portion 146 may be adjusted so the resulting semiconductor structure 100b can have the improved resistance and/or operating voltage. In some embodiments, the thickness $T_b$ of portion 146b is in a range of 10 Å to about 500 Å.

FIGS. 3A to 3D are cross-sectional representations of various stages of forming a semiconductor structure 100c in accordance with some embodiments. Semiconductor structure 100c is similar to, or the same as, semiconductor structure 100a described in FIGS. 1A to 1D, except the formation of second trench 124c is different from that in FIGS. 1A to 1D. Materials and processes used to form semiconductor structure 100c may be the same as, or similar to, those used to form semiconductor structure 100a and are not repeated herein as they have been described previously.

Figure 3A:
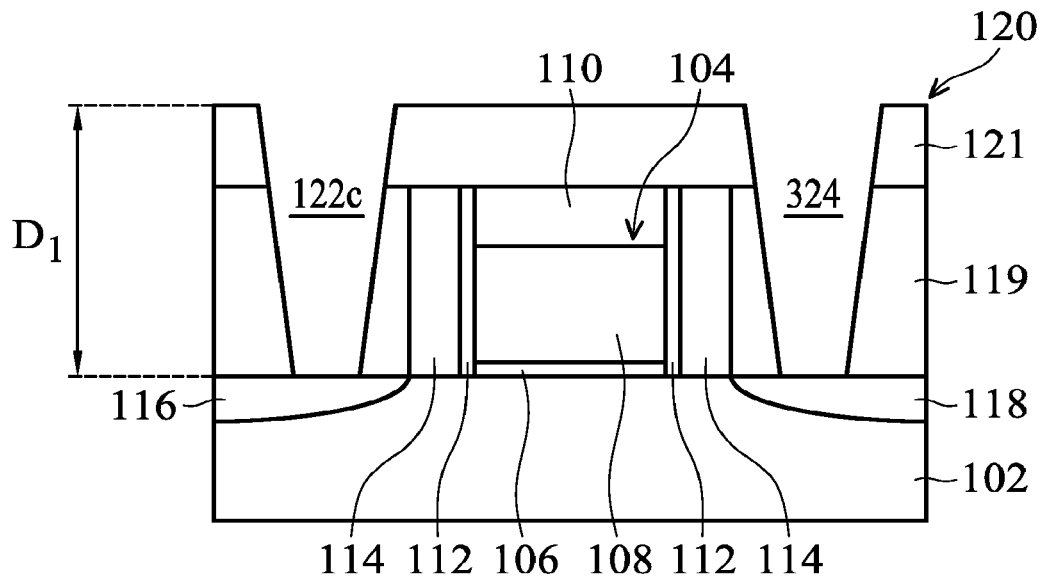
FIGS. 3A to 3D are cross-sectional representations of various stages of forming a semiconductor structure in accordance with some embodiments.

More specifically, when a first trench 122c is formed over first source/drain structure 116, a temporary trench 324 is also formed over second source/drain structure 118, as shown in FIG. 3A in accordance with some embodiments. As shown in FIG. 3A, both first trench 122c and second trench 124c are formed through interlayer dielectric layer 120. Therefore, first source/drain structure 116 is exposed by first trench 122c, and second source/drain structure 118 is exposed by temporary trench 324. In some embodiments, the depth of temporary trench 324 is substantially equal to the depth $D_1$ of first trench 122c.

Figure 3B:
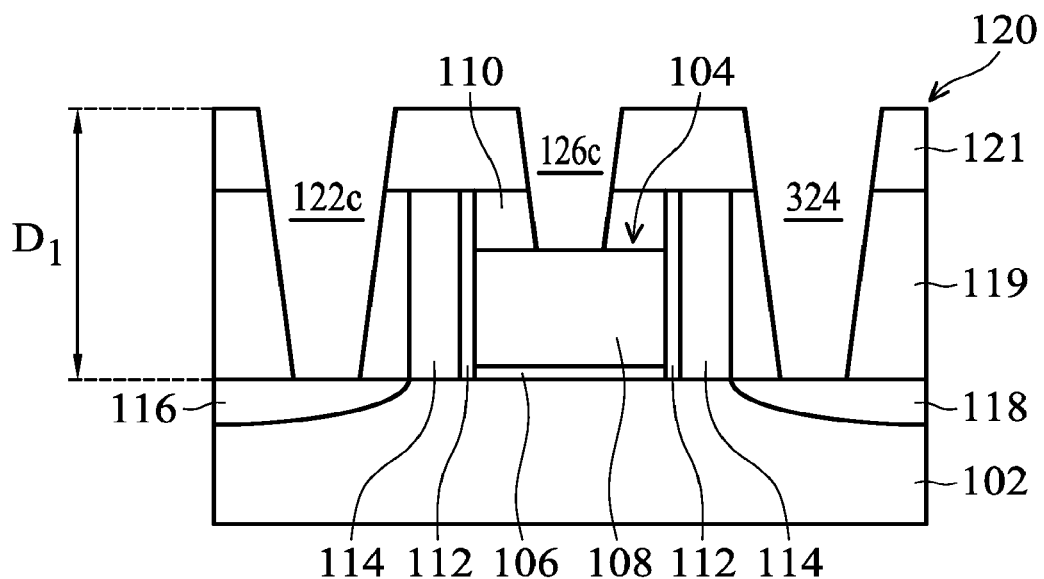
Figure 3C:
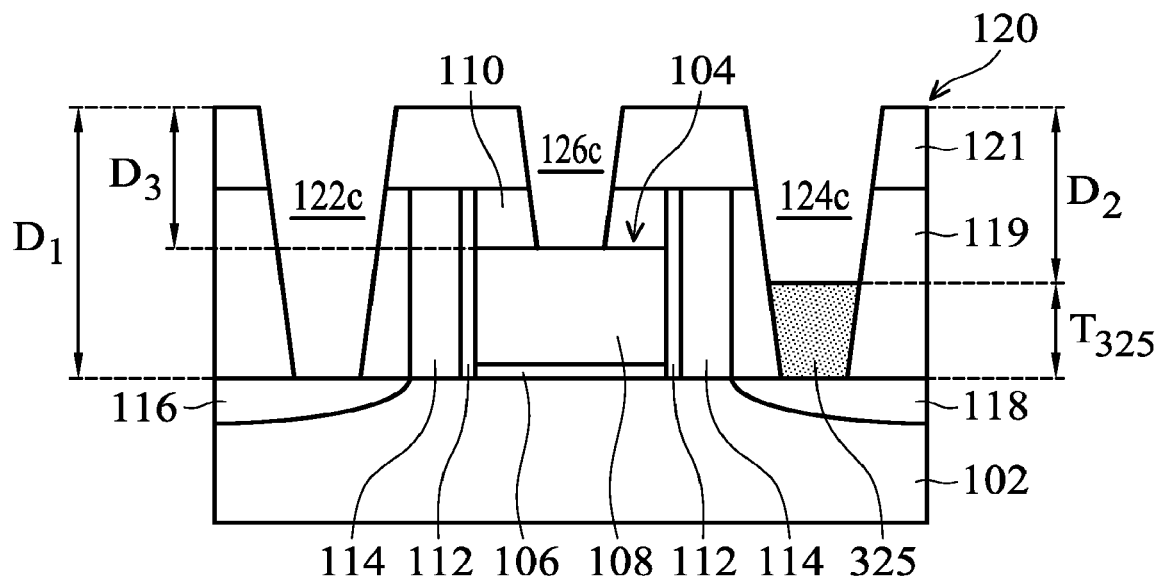

After temporary trench 324 is formed, a third trench 126c is formed through interlayer dielectric layer 120 and hard mask layer 110, as shown in FIG. 3B in accordance with some embodiments. After the formation of first trench 122, temporary trench 324, and third trench 126b is completed, an additional dielectric layer 325 is formed in the bottom of temporary trench 324, as shown in FIG. 3C in accordance with some embodiments.

More specifically, additional dielectric layer 325 is deposited in the bottom of temporary trench 324 to form a second trench 124c, such that second trench 124c does not expose second source/drain structure 118. In some embodiments, additional dielectric layer 325 has a thickness $T_{325}$ in a range from about 10 Å to about 2000 Å. In some embodiments, additional dielectric layer 325 is made of silicon oxide, silicon nitride, silicon oxynitride, phosphosilicate glass (PSG), borophosphosilicate glass (BPSG), or the like. It should be noted that additional dielectric layer 325 may include one or multiple layers made of one or multiple dielectric materials.

After first trench 122, second trench 124b, and third trench 126b are formed, a first conductive structure 128c, a second conductive structure 130c, and a third conductive structure 132c are formed in first trench 122c, second trench 124c, and third trench 126c, respectively. In addition, first conductive structure 128c, second conductive structure 130c, and third conductive structure 132c also include barrier layers 134, 138, and 142 and conductive layers 136, 140, and 144 in accordance with some embodiments. Materials used to form first conductive structure 128c, second conductive structure 130c, and third conductive structure 132c may be similar to, or the same as, those used to form first conductive structure 128, second conductive structure 130, and third conductive structure 132 shown in FIG. 1D and described previously and are not repeated herein.

Figure 3D:
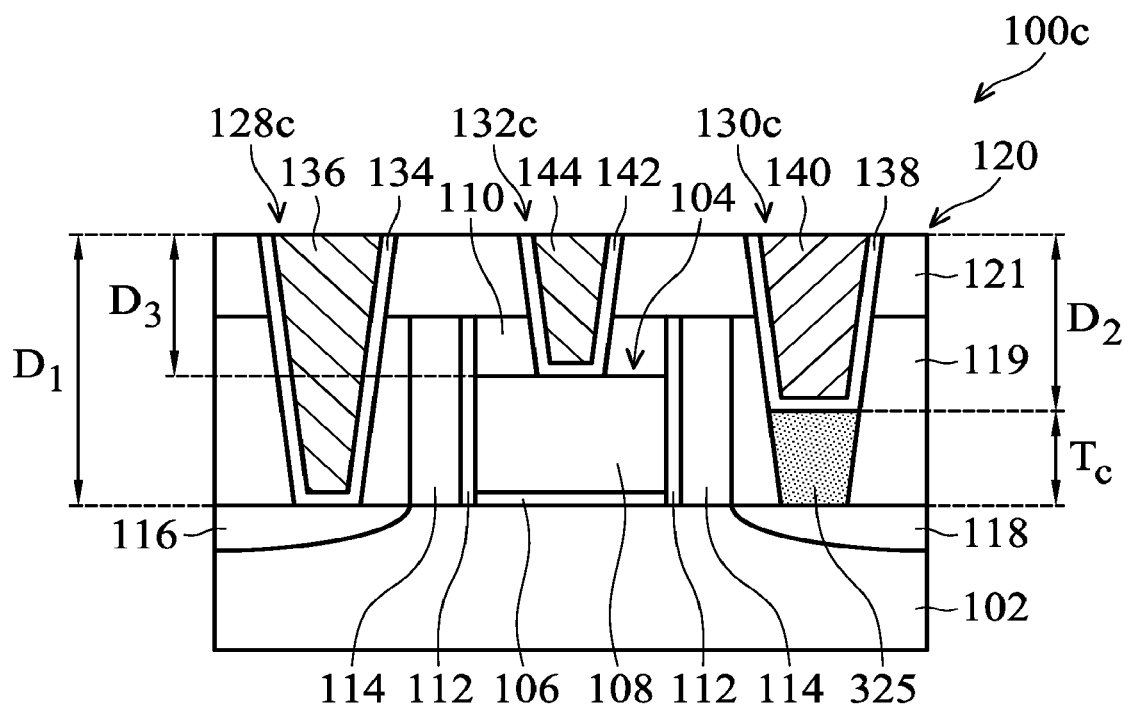

As shown in FIG. 3D, second conductive structure 130c is separated from second source/drain structure 118 by additional dielectric layer 325. That is, although first conductive structure 128c is in direct contact with first source/drain structure 116, second conductive structure 130c is not in direct contact with second source/drain structure 118.

In addition, additional dielectric layer 325 is formed in an individual process. Therefore, the thickness and the material of additional dielectric layer 325 can be adjusted according to its applications. In some embodiments, additional dielectric layer 325 and interlayer dielectric layer 120 are made of different materials.

As shown in FIGS. 3A to 3C, second trench 124c is formed by forming temporary trench 324 and depositing additional dielectric layer 325 in the bottom of temporary trench 324. Therefore, the second depth $D_2$ can be adjusted by depositing additional dielectric layer 325 to a designated thickness. Accordingly, the second depth $D_2$ can be adjusted more freely and separately without limiting by the formation of third trench 126b.

In addition, since second conductive structure 130c is formed in second trench 124c, second conductive structure 130c is separated from second source/drain structure 118 by additional dielectric layer 325. That is, second conductive structure 130c and second source/drain structure 118 is separated from each other by distance $T_c$, which is equal to the thickness $T_{325}$ of additional dielectric layer 325, as shown in FIGS. 3C and 3D. In some embodiments, the distance $T_c$ (i.e. the thickness $T_{325}$ of additional dielectric layer 325) is in a range of 10 Å to about 2000 Å.

Furthermore, the thickness and materials of additional dielectric layer 325 may be altered according to its application, so that the resulting semiconductor structure 100c can have the designated resistance and/or operating voltage. Therefore, function of semiconductor structure 100c may have more variety and may be applied to various applications.

Figure 4A:
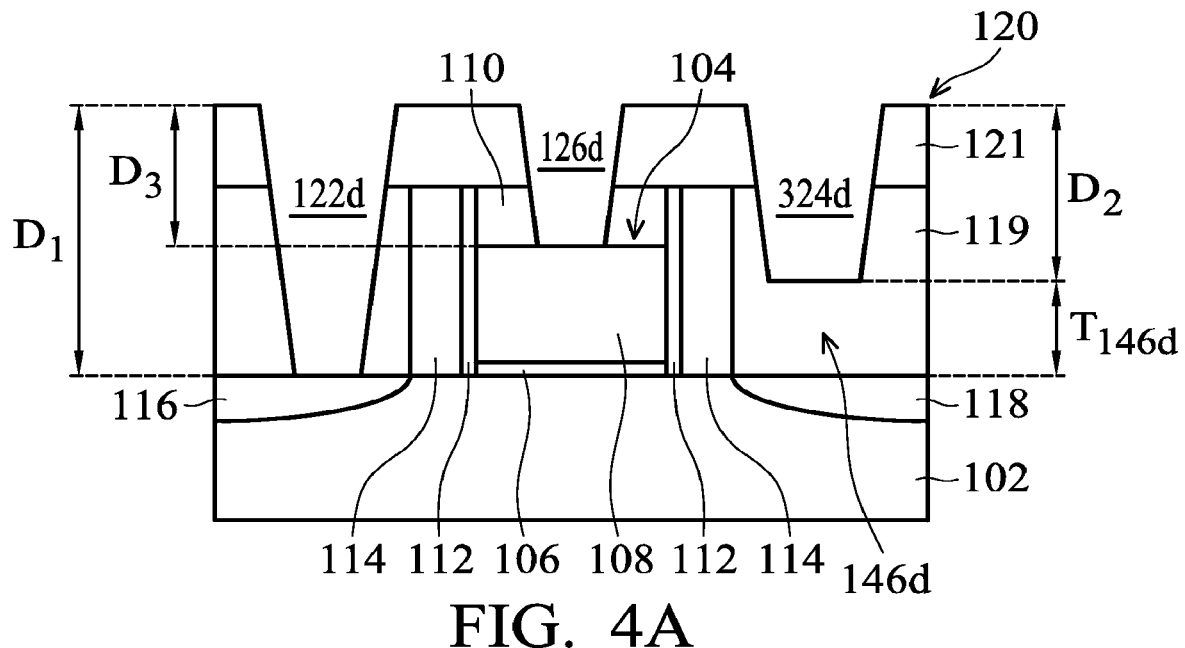
FIGS. 4A to 4C are cross-sectional representations of various stages of forming a semiconductor structure in accordance with some embodiments.
Figure 4B:
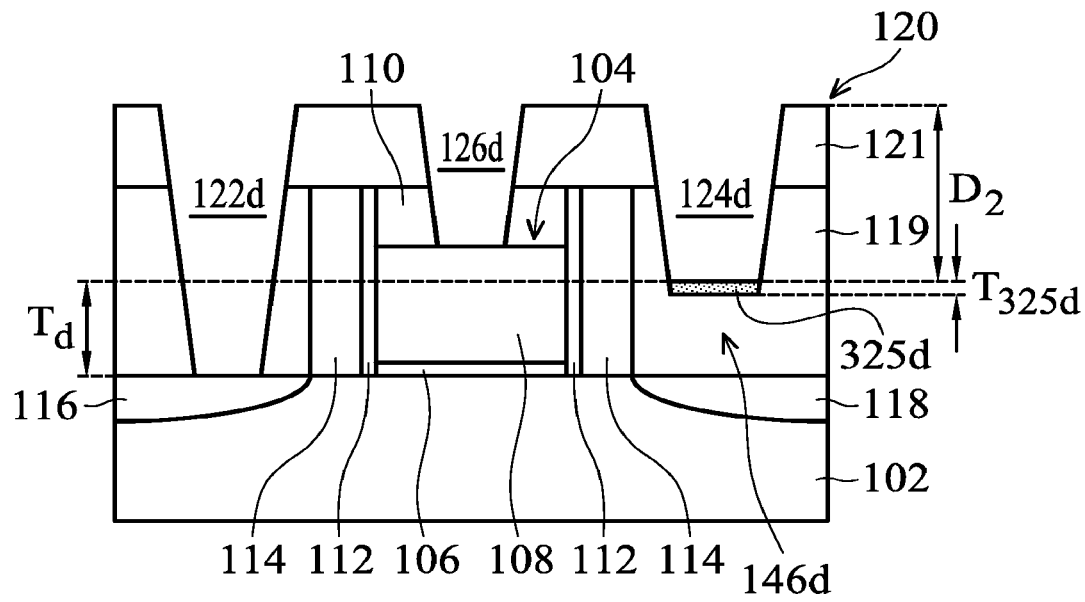
Figure 4C:
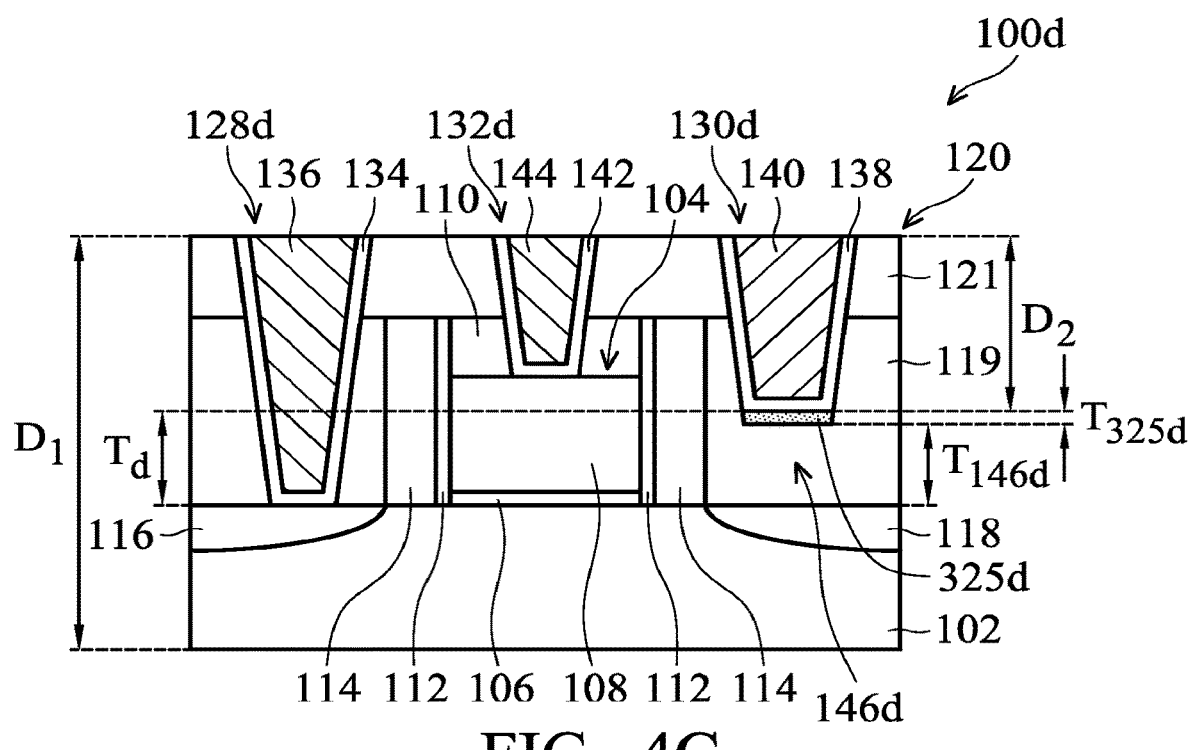

FIGS. 4A to 4C are cross-sectional representations of various stages of forming a semiconductor structure 100d in accordance with some embodiments. Semiconductor structure 100d is similar to, or the same as, semiconductor structure 100a described in FIGS. 1A to 1D, except the formation of second trench 124d is different from that in FIGS. 1A to 1D. Materials and processes used to form semiconductor structure 100d may be the same as, or similar to, those used to form semiconductor structure 100a described previously and are not repeated herein.

More specifically, a first trench 122d is formed through interlayer dielectric layer 120 over first source/drain structure 116, and third trench 126d is formed through interlayer dielectric layer 120 and hard mask layer 110 over gate structure 104, as shown in FIG. 4A in accordance with some embodiments. In addition, a temporary trench 324d is formed over second source/drain structure 118.

Methods and materials used to form first trench 122d may be similar to, or the same as those used to form first trench 122 shown in FIGS. 1B, 2A, and 3A, and methods and materials used to form third trench 126d may be similar to, or the same as those used to form third trenches 126, 126b, and 126c in FIGS. 1C, 2B, and 3B. In addition, methods and materials used to form temporary trench 324d may be similar to, or the same as those used to form second trenches 124, 124b, and 124c in FIGS. 1C, 2B, and 3C. For example, temporary trench 324d and third trench 126d are formed in the same patterning process in accordance with some embodiments. As shown in FIG. 4A, a portion 426d is left between temporary trench 324d and second source/drain structure 118, and portion 426d has a thickness $T_{146d}$.

After temporary trench 324d is formed, an additional dielectric layer 325d is formed in the bottom of temporary trench 324d, as shown in FIG. 4B in accordance with some embodiments. More specifically, additional dielectric layer 325d is deposited in the bottom of temporary trench 324d to form a second trench 124d.

In some embodiments, additional dielectric layer 325d has a thickness $T_{325d}$ in a range from about 5 Å to about 500 Å. In some embodiments, additional dielectric layer 325d is silicon oxide, silicon nitride, silicon oxynitride, phosphosilicate glass (PSG), borophosphosilicate glass (BPSG), or the like. It should be noted that additional dielectric layer 325d may include one or multiple layers made of one or multiple dielectric materials. In some embodiments, additional dielectric layer 325d and interlayer dielectric layer 120 are made of different dielectric materials.

After first trench 122, second trench 124d, and third trench 126 are formed, a first conductive structure 128d, a second conductive structure 130d, and a third conductive structure 132d are formed in first trench 122, second trench 124d, and third trench 126 respectively. In addition, first conductive structure 128d, second conductive structure 130d, and third conductive structure 132d also include barrier layers 134, 138, and 142 and conductive layers 136, 140, and 144 in accordance with some embodiments. Methods and materials used to form first conductive structure 128d, second conductive structure 130d, and third conductive structure 132d may be similar to, or the same as, those used to form the previously described first conductive structure 128, second conductive structure 130, and third conductive structure 132 shown in FIG. 1D, and these descriptions are not repeated herein.

As shown in FIG. 4C, second conductive structure 130d is separated from second source/drain structure 118 by interlayer dielectric layer 120 and additional dielectric layer 325d. That is, although first conductive structure 128d is in direct contact with first source/drain structure 116, second conductive structure 130d is not in direct contact with second source/drain structure 118.

In addition, the thickness and the material of additional dielectric layer 325d can be adjusted according to its applications. In some embodiments, additional dielectric layer 325 and interlayer dielectric layer 120 are made of different materials.

As shown in FIG. 4B, additional dielectric layer 325d is formed in temporary trench 324d, such that second conductive structure 130d and second source/drain structure 118 are separated by a portion 146d of interlayer dielectric layer 120 and additional dielectric layer 325d. Accordingly, second conductive structure 130d and second source/drain structure 118 are separated by a distance $T_d$, which is equal to the sum of the thickness $T_{325d}$ of additional dielectric layer 325d and the thickness $T_{146d}$ of portion 146d of interlayer dielectric layer 120. In some embodiments, distance $T_d$ is in a range of 15 Å to about 1000 Å.

Similarly, since the thickness and materials of additional dielectric layer 325d may be altered according to its application, the resulting semiconductor structure 100d can have the designated resistance and/or operating voltage. Therefore, function of semiconductor structure 100d may have more variety and may be applied to various applications.

As described previously, a second conductive structure, such as second conductive structures 130, 130b, 130c, and 130d, are formed without in direct contact with any source/drain structure, such as second source/drain structure 118. That is, the second conductive structure is separated from the source/drain structure below it by a dielectric material, such as portion 146, 146b, and 146d and additional dielectric layers 325 and 325d. The dielectric material positioned between the second conductive structure and the source/drain structure can be used for data storage. Accordingly, the semiconductor structure, such as semiconductor structures 100a, 100b, 100c, and 100d described above, can be used as a memory unit, such as a one-time programmable (OTP) memory unit or a resist random access memory (RRAM) unit.

Embodiments of semiconductor structures and methods for manufacturing the same are provided. The semiconductor structure includes a gate structure formed over a substrate and first and second source/drain structures formed at the opposite sides of the gate structure in the substrate. A conductive structure is formed over the first source/drain structure and is in direct contact with the first source/drain structure. In addition, a second conductive structure is formed over the second source/drain structure but is not in direct contact with the second source/drain structure. That is, a dielectric portion is positioned between the second source/drain structure and the second conductive structure to separate them. In addition, the dielectric portion between the second source/drain structure and the second conductive structure can be used for data storage in a memory unit.

In some embodiments, a semiconductor structure is provided. The semiconductor structure includes a substrate and a gate structure formed over the substrate. The semiconductor structure further includes a first source/drain structure and a second source/drain structure formed in the substrate adjacent to the gate structure. The semiconductor structure further includes an interlayer dielectric layer formed over the substrate to cover the gate structure, the first source/drain structure, and the second source/drain structure. The semiconductor structure further includes a first conductive structure formed in the interlayer dielectric layer over the first source/drain structure. The semiconductor structure further includes a second conductive structure formed in the interlayer dielectric layer over the second source/drain structure. In addition, the first conductive structure is in direct contact with the first source/drain structure, and the second conductive structure is not in direct contact with the second source/drain structure.

In some embodiments, a semiconductor structure is provided. The semiconductor structure includes a substrate and a gate structure formed over the substrate. The semiconductor structure further includes a first source/drain structure formed adjacent to a first side of the gate structure in the substrate. The semiconductor structure further includes a second source/drain structure formed adjacent to a second side of the gate structure in the substrate. The semiconductor structure further includes an interlayer dielectric layer formed over the substrate to cover the gate structure, the first source/drain structure, and the second source/drain structure. The semiconductor structure further includes a first conductive structure formed through the interlayer dielectric layer on the first source/drain structure. The semiconductor structure further includes a second conductive structure formed in the interlayer dielectric layer over the second source/drain structure. In addition, the first conductive structure is in direct contact with the first source/drain structure, and the second conductive structure and the second source/drain structure are separated by a portion of the interlayer dielectric layer.

In some embodiments, a method for manufacturing a semiconductor structure is provided. The method for manufacturing a semiconductor structure includes forming a gate structure over a substrate and forming a first source/drain structure and a second source/drain structure in the substrate adjacent to the gate structure. The method for manufacturing a semiconductor structure further includes forming an interlayer dielectric layer over the substrate to cover the gate structure, the first source/drain structure, and the second source/drain structure. The method for manufacturing a semiconductor structure further includes forming a first trench through the interlayer dielectric layer to expose the first source/drain structure. The method for manufacturing a semiconductor structure further includes forming a second trench in the interlayer dielectric layer over the second source/drain structure, and the second source/drain structure is not exposed by the second trench. The method for manufacturing a semiconductor structure further includes forming a first conductive structure in the first trench and forming a second conductive structure in the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a gate structure formed over a substrate;
   a first source/drain structure and a second source/drain structure formed in the substrate adjacent to the gate structure;
   an interlayer dielectric layer formed over the substrate and over the gate structure, the first source/drain structure, and the second source/drain structure;
   a first conductive structure formed in the interlayer dielectric layer over the first source/drain structure; and
   a second conductive structure formed in the interlayer dielectric layer over the second source/drain structure,
   wherein the first conductive structure is in direct contact with the first source/drain structure, and the second conductive structure is vertically aligned with the second source/drain structure and is not in direct contact with the second source/drain structure.

2. The semiconductor structure as claimed in claim 1, wherein the second source/drain structure and the second conductive structure are separated by a portion of the interlayer dielectric layer.

3. The semiconductor structure as claimed in claim 1, wherein the second source/drain structure and the second conductive structure are separated by a portion of the interlayer dielectric layer and an additional dielectric layer, and the interlayer dielectric layer and the additional dielectric layer are made of different materials.

4. The semiconductor structure as claimed in claim 1, wherein the second conductive structure and the second source/drain structure are separated from each other by a vertical distance in a range from about 15 Å to about 500 Å.

5. The semiconductor structure as claimed in claim 1, further comprising:
   a third conductive structure connecting to the gate structure, wherein the third conductive structure is level with the first conductive structure and second conductive structure.

6. The semiconductor structure as claimed in claim 1, wherein the first conductive structure has a first depth from a first top surface to a first bottom surface, and the second conductive structure has a second depth from a second top surface to a second bottom surface, the second depth which is smaller than the first depth.

7. The semiconductor structure as claimed in claim 1, wherein a top surface of the first conductive structure is substantially level with a top surface of the second conductive structure.

8. A semiconductor structure, comprising:
   a gate structure formed over a substrate;
   a first source/drain structure formed adjacent to a first side of the gate structure in the substrate;
   a second source/drain structure formed adjacent to a second side of the gate structure in the substrate;
   an interlayer dielectric layer formed over the substrate and over the gate structure, the first source/drain structure, and the second source/drain structure;
   a first conductive structure extending through the interlayer dielectric layer and interfacing the first source/drain structure; and
   a second conductive structure within the interlayer dielectric layer and over and vertically aligned above the second source/drain structure,
   wherein the first conductive structure is in direct contact with the first source/drain structure, and wherein a bottommost surface of the second conductive structure is higher than a top surface of the second source/drain structure.

9. The semiconductor structure as claimed in claim 8, wherein a portion of the interlayer dielectric layer is between the second conductive structure and the second source/drain structure has a thickness in a range from about 15 Å to about 1000 Å.

10. The semiconductor structure as claimed in claim 8, wherein the second source/drain structure and the second conductive structure are further separated by an additional dielectric layer, and the interlayer dielectric layer and the additional dielectric layer are made of different materials.

11. The semiconductor structure as claimed in claim 8, wherein a top surface of the first conductive structure is substantially level with a top surface of the second conductive structure, and the first conductive structure has a first depth and the second conductive structure has a second depth, which is smaller than the first depth.

12. The semiconductor structure as claimed in claim 8, wherein a portion of the interlayer dielectric layer interposes the bottom surface of the second conductive structure and a top surface of the second source/drain structure.

13. The semiconductor structure as claimed in claim 12, wherein the portion of the interlayer dielectric layer extends from interfacing the bottom surface of the second conductive structure to interfacing the top surface of the second source/drain structure.

14. The semiconductor structure as claimed in claim 12, wherein a second dielectric layer interposes the portion of the interlayer dielectric layer and the bottom surface of the second conductive structure.

15. The semiconductor structure as claimed in claim 1, wherein a dielectric material extends from a bottom surface of the second conductive structure to a top surface of the second source/drain structure.

16. A semiconductor structure, comprising:
   a gate structure formed over a substrate;
   a first source/drain structure formed adjacent to a first side of the gate structure in the substrate;
   a second source/drain structure formed adjacent to a second side of the gate structure in the substrate;
   a first conductive structure interfacing the first source/drain structure; and
   a second conductive structure formed level with the first conductive structure and vertically disposed over the second source/drain structure, wherein the second conductive structure is separated from the second source/drain structure by at least one dielectric material, wherein the at least one dielectric material directly interfaces the second conductive structure.

17. The semiconductor structure of claim 16, further comprising:
   an interlayer dielectric (ILD) layer formed over the gate structure, wherein the first and second conductive structures extend into the ILD layer and wherein the at least one dielectric material directly interfaces the second source/drain structure.

18. The semiconductor structure of claim 17, wherein the at least one dielectric material includes the ILD layer, wherein the ILD layer directly interfaces the second conductive structure.

19. The semiconductor structure of claim 16, wherein the dielectric material includes at least one of silicon oxide, silicon nitride, silicon oxynitride, phosphosilicate glass (PSG), and borophosphosilicate glass (BPSG).

20. The semiconductor structure of claim 16, wherein the at least one dielectric material contiguously extends from the direct interface with a bottom surface of the second conductive structure to a direct interface with a top surface of the second source/drain structure.

\* \* \* \* \*